(12) United States Patent
Satapathy et al.

(10) Patent No.: US 8,811,925 B2
(45) Date of Patent: *Aug. 19, 2014

(54) SYSTEM AND METHOD FOR PROVIDING EXTERNAL RECEIVER GAIN COMPENSATION WHEN USING AN ANTENNA WITH A PRE-AMPLIFIER

(75) Inventors: Durga P. Satapathy, Ashburn, VA (US); Walter Rausch, Shawnee, KS (US)

(73) Assignee: Clearwire IP Holdings LLC, Bellevue, WA (US)

( * ) Notice: Subject to any disclaimer, the term of this patent is extended or adjusted under 35 U.S.C. 154(b) by 1364 days.

This patent is subject to a terminal disclaimer.

(21) Appl. No.: 12/481,697

(22) Filed: Jun. 10, 2009

(65) Prior Publication Data

US 2010/0315978 A1    Dec. 16, 2010

(51) Int. Cl.
*H04B 1/06* (2006.01)

(52) U.S. Cl.
USPC .... 455/234.1; 455/553.1; 455/73; 455/232.1; 370/336; 370/328; 370/329; 370/294; 375/297

(58) Field of Classification Search
USPC .......... 455/73, 553.1, 234.1, 232.1; 375/297; 343/700 MS; 701/37; 370/336, 328, 370/329, 294
See application file for complete search history.

(56) References Cited

U.S. PATENT DOCUMENTS

| | | | |
|---|---|---|---|
| 5,206,655 A * | 4/1993 | Caille et al. | 343/700 MS |
| 6,313,713 B1 | 11/2001 | Ho et al. | 333/1.1 |
| 6,956,896 B2 | 10/2005 | Johnson | 375/224 |
| 8,027,646 B1 | 9/2011 | Rausch et al. | 455/80 |
| 2004/0106381 A1 | 6/2004 | Tiller | |
| 2005/0192727 A1 | 9/2005 | Shostak et al. | |
| 2007/0243899 A1 * | 10/2007 | Hermel et al. | 455/553.1 |
| 2008/0074324 A1 | 3/2008 | Puzella et al. | |
| 2008/0260066 A1 | 10/2008 | Cai et al. | |
| 2009/0296666 A1 * | 12/2009 | Rimini | 370/336 |

FOREIGN PATENT DOCUMENTS

WO    WO 2010/144292    12/2010

OTHER PUBLICATIONS

International Search Report and Written Opinion for PCT/US2010/037144 mailed Aug. 17, 2010, 14 pages.
International Preliminary Examination Report for PCT/US2010/037144 mailed Jun. 21, 2011, 20 pages.

* cited by examiner

*Primary Examiner* — Junpeng Chen (57) ABSTRACT

In various embodiments, a system and method for improving a noise figure (NF) of a time division duplex (TDD) communications system includes a pre-amplified antenna unit having a plurality of antennas and associated low-noise amplifiers (LNA). Each of the associated LNA's is arranged to receive signals from a phase-matched pair of antennas selected from the plurality of antennas. For each of the phase-matched antenna pairs, a variable negative gain circuit may be coupled to a TDD signal output of the associated LNA such that a remote radio head (RRH) may be suitably coupled to an output of the variable gain circuit. The variable gain circuit is configured to provide a negative gain to the TDD signal appropriate to ensure that a dynamic range of the RRH is not reduced from a desired dynamic range due to excess gain provided by the LNA. A method of retrofitting a conventional pre-amplified antenna unit includes inserting a variable negative gain circuit so that the modified pre-amplified antenna may be used with any vendor's RRH.

29 Claims, 7 Drawing Sheets

FIG. 1A (BACKGROUND)

FIG. 1B (BACKGROUND)

(NON-AMPLIFYING ANTENNA WITH NO RECEIVER GAIN COMPENSATION)

FIG. 1C (BACKGROUND)
(PRE-AMPLIFIED ANTENNA WITH CUSTOM RRH)

(PRE-AMPLIFIED ANTENNA WITH GENERIC RRH AND NEGATIVE GAIN COMPENSATION)

SYSTEM AND METHOD FOR PROVIDING EXTERNAL RECEIVER GAIN COMPENSATION WHEN USING AN ANTENNA WITH A PRE-AMPLIFIER

CROSS-REFERENCE TO RELATED APPLICATIONS

This application is related to copending application Ser. No. 12/251,657 filed on Oct. 15, 2008 and entitled "COMMUNICATION SYSTEM AND METHOD FOR FILTERING AND ATTENUATING A SIGNAL BETWEEN AN ANTENNA SYSTEM AND A BASE STATION" by Rausch et al. and owned by Clear Wireless, LLC, the entire contents of which are incorporated herein by reference.

BACKGROUND

In one or more embodiments, this disclosure is directed to a system and method useful for providing variable negative receiver gain compensation when using an antenna with a pre-amplifier, and for improving the overall system Noise Figure (NF) in a time-division duplex (TDD) communication system. In other embodiments, this disclosure is directed to a variable gain circuit configured to receive a TDD communication signal from a pre-amplified antenna unit at a first power level and to output the communication signal to a remote radio head (RRH) at a second power level different than the first power level. The variable gain circuit may be retrofitted into an "off-the-shelf" pre-amplified antenna unit.

The ever-increasing size of wireless networks has led to the development of new communication system architectures. Traditional telecommunication base stations have baseband and radio-frequency (RF) components mounted inside an air-conditioned hut with co-axial cables transmitting signals to remote antennas. Conventionally, antennas were not provided with amplification before the signals are transmitted for further processing.

However, the wireless industry is moving away from base station architectures to distributed network and Remote Radio Head (RRH) architectures where the baseband components are digitally connected to a group of RF components mounted on top of antenna towers. This approach reduces the RF power requirements from the power amplifier (PA) and improves signal transfer through the use of fiber-optic cables. In addition, a central base station connected to multiple antennas eliminates the need for the redundancy of baseband units, reducing both capital and maintenance costs.

Figure 1A:
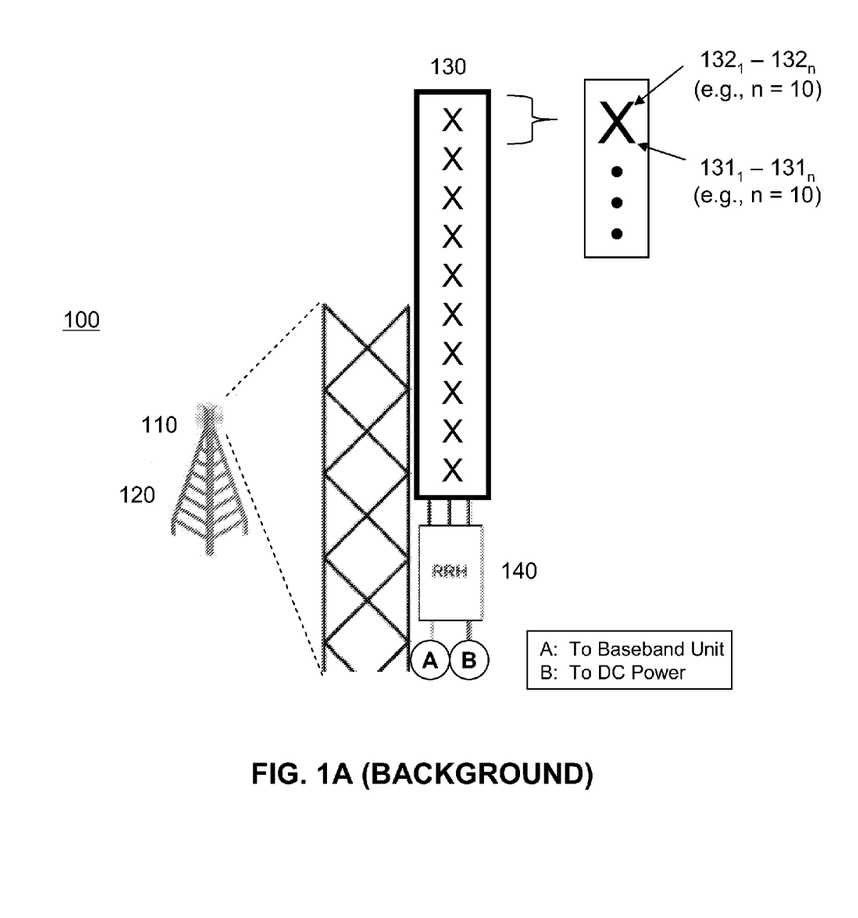
FIG. 1A provides an illustration of a conventional antenna system using a non-amplified antenna unit with a remote radio head.

FIG. 1A provides a simplified representation of a conventional communication system 100 feeding an RRH without a pre-amplified antenna unit. Conventional communication system 100 includes tower-top antenna system 110 sitting atop tower 120. Tower top antenna system 110 includes antenna unit 130 with multiple antennas 131$n$ and 132$n$. In one exemplary implementation of antenna unit 130 with n=10, 20 antenna elements may be used to form two "phase-matched" antenna arrays—a first antenna array that includes the "−45°" elements (i.e., antenna elements $131_1$-$131_{10}$), and a second antenna array that includes the "+45°" elements (i.e., antenna elements $132_1$-$132_{10}$). First and second phase-matched array outputs of antenna unit 130 are provided to RRH 140 which provides a communication signal to a baseband unit in a ground station (not shown) attached to node "A". Power may be provided via node "B" to RRH 140 and antenna unit 130 from the ground station. Antenna unit 130 may comprise bar, dipole, patch, parabolic, dish, array, or some other type of antenna. Different arrays may be used, i.e., where n>10, or n<10.

Figure 1B:
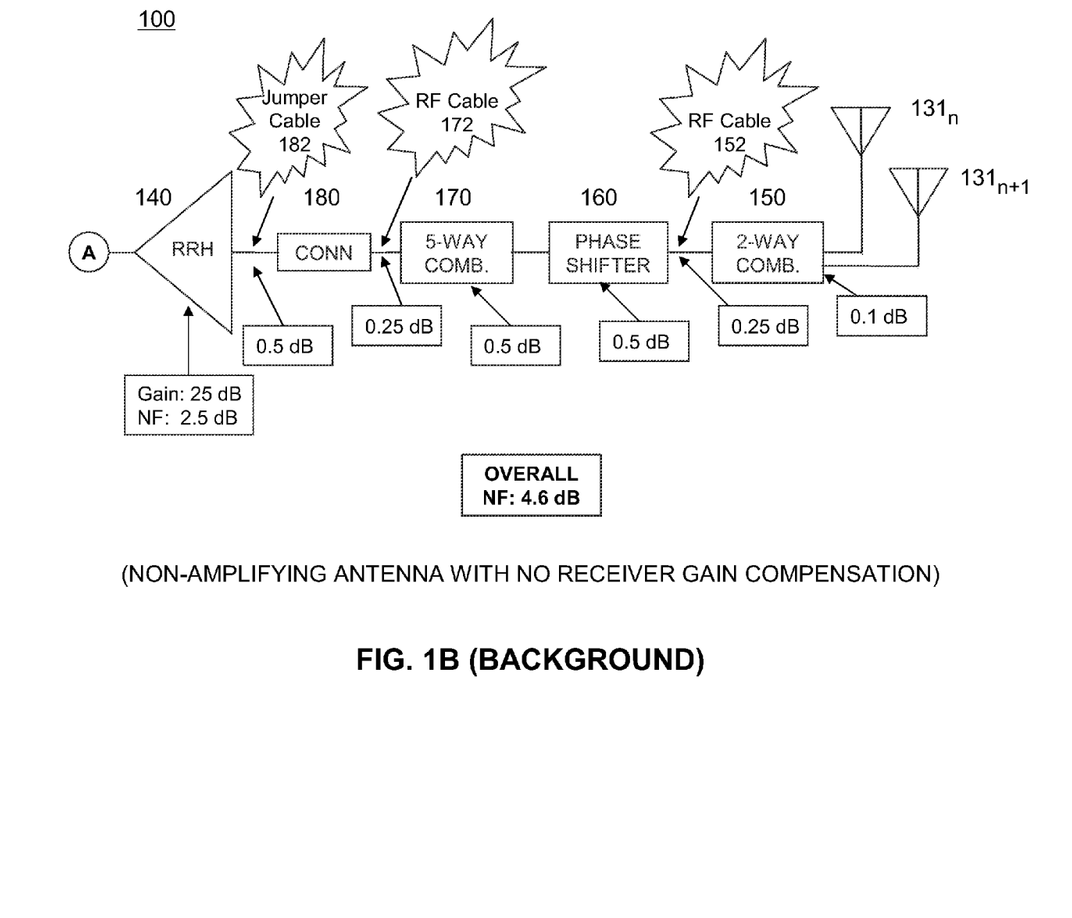
FIG. 1B provides further component details relating to the conventional antenna system of FIG. 1A.

FIG. 1B illustrates further details of conventional communication system 100 for a receive path in which antenna elements having the same phase, e.g., antenna elements 131$n$ and $131_{n+1}$ (i.e., two "−45°" elements) are combined in two-way power combiner 150, provided over RF cable 152 to phase-shifter 160, and combined with similar signals from remaining combinations of antenna elements $131_n$ and $131_{n+1}$ in 5-way power combiner 170. RF cable 172 connects an output of 5-way combiner 170 to connector 180 which is further connected to jumper cable 182 for application to an input of RRH 140. FIG. 1B also provides representative losses (in decibels) for each component in conventional communication system 100. In this example, the combination of losses contribute to an overall noise figure (NF) of 4.6 dB. For simplicity, the second antenna array that includes the "+45°" elements (i.e., antenna elements $132_1$-$132_{10}$) is not shown, but it should be understood that these elements may be arranged in a "mirror image" fashion similar to that for the "−45°" elements (i.e., antenna elements $131_1$-$131_{10}$).

Table I below provides a representative calculation using the known Friis Equations for determining the NF of conventional communications system 100 that uses a non-amplified or "plain" antenna unit 130.

TABLE I

| Friis Equations for Concatenated Noise Figure | | | | | | | | | |
|---|---|---|---|---|---|---|---|---|---|
| Calculation for Non-Amplified Antenna and no Receiver Gain Compensation | | | | | | | | | |
| | Input Jumper | LNA+ | Jumper #1 | Phase Shifter | 5-way Divider | Jumper #2 | RGC Circuit | Jumper #3 + Con. | RRH |
| Component Data (from specifications) | | | | | | | | | |
| Gain (dB) | −0.1 | 0 | −0.25 | −0.5 | −0.5 | −0.25 | 0 | −0.5 | 25 |
| NF (dB) | 0.1 | 0 | 0.25 | 0.5 | 0.5 | 0.25 | 0 | 0.5 | 2.5 |
| Calculated linear data (=10^(dB/10)) | | | | | | | | | |
| Gain (linear) | 0.97723722 | 1 | 0.944061 | 0.891251 | 0.891251 | 0.944061 | 1 | 0.891251 | 316.2278 |
| NF (linear) | 1.02329299 | 1 | 1.059254 | 1.122018 | 1.122018 | 1.059254 | 1 | 1.122018 | 1.778279 |

TABLE I-continued

| Running total (cascaded) gain (product of linear gains) | | | | | | | | | |
|---|---|---|---|---|---|---|---|---|---|
| Gain (linear) | 0.97723722 | 0.9772372 | 0.922571 | 0.822243 | 0.732825 | 0.691831 | 0.691831 | 0.616595 | 194.9845 |
| Running total (cascaded) F (use Friis Formula) | | | | | | | | | |
| NF (linear) | 1.02329299 | 1.023293 | 1.083927 | 1.216186 | 1.364583 | 1.44544 | 1.44544 | 1.62181 | 2.884032 |
| Cascaded gain and noise figure (convert back to dB) | | | | | | | | | |
| NF (dB) | 0.1 | 0.1 | 0.35 | 0.85 | 1.35 | 1.6 | 1.6 | 2.1 | 4.6 |
| Gain (dB) | -0.1 | -0.1 | -0.35 | -0.85 | -1.35 | -1.6 | -1.6 | -2.1 | 22.9 |

Total Gain Needs to be close to RRH Gain to protect receiver
Total Concatenated Noise Figure This NF of 4.6 dB may not be suitable for some system requirements.

Another more recent conventional approach uses an antenna product by KMW Communications, Inc., originally configured for use in base station architectures. This antenna product is known as the "LNA+", and incorporates an antenna arrangement with an integral built-in Tower-Top Low Noise Amplifier (TTLNA or LNA) behind each active pair of antenna elements to reduce losses and improve the receiver's NF. By placing amplifiers immediately behind the active elements inside the antenna to provide a "pre-amplified" antenna, jumper and phasing wiring harness losses do not contribute to net NF, providing an advantage over an external TTLNA used in conventional base station architectures and over the use of "plain" antennas as discussed above with respect to FIGS. 1A and 1B.

KMW's LNA+ is a full band TTLNA with vertical and horizontal azimuth steering capable antenna controlled by Antenna Interface Standards Group (AISG) protocol (e.g., version 2.0) with phase shifters all in one radome. "Redundant" LNA+'s are provided in each of 10 TTLNA modules. This technology is reported to improve uplink NF by balancing the transmit (TX) link with the larger footprint per cell, and improve uplink data through to existing cells. Because the components are inside one radome, extra cabling and water intrusion is eliminated, along with their associated losses and maintenance issues. This approach using a pre-amplified antenna eliminates the need for expensive high-gain antennas.

The LNA+ may be used in base station architectures. However, to operate within its design dynamic range (DR), a receiver using a pre-amplifier to overcome feedline losses in conjunction with a pre-amplified antenna as described above, e.g., a TTLNA or LNA used in base station receiver architectures, must incorporate a fixed value of receiver gain compensation (RGC) to avoid overdriving the receiver, as described in copending application Ser. No. 12/251,657 by Rausch et al. In this conventional application, it is important to protect receiver performance by constructing the LNA circuit such that only sufficient amplification is added to balance the loss in the feeder system between the LNA and the base station receiver without overdriving the receiver and degrading its DR. The RGC circuit may be "preset" by a technician to a fixed negative gain value appropriate for use between a particular base station receiver and pre-amplified antenna system Rausch et al. provides a novel circuit that, if installed in the bottom of the KMW LNA+ antenna, would allow a technician to "pre-set" negative receiver gain compensation at the antenna during installation to match the pre-amplified antenna to the particular base station receiver.

The relatively new LNA+ pre-amplified antenna approach described above can also be used in an RRH architecture, but with certain restrictions. For example, the RRH must be specifically built for that function, i.e., an RRH must be specifically configured and adapted for use with the particular pre-amplified antenna to avoid overdriving the RRH with too high a signal level from the pre-amplified antenna. Reconfiguration and adaptation of multiple RRHs that are found in conventional wireless radio transmission systems add expense and installation/update time, particularly given the large number of potentially different RRHs that may be necessary in a typical system RRH units from most current vendors do not incorporate an RGC, particularly one which prevents overdriving of its front-end by the pre-amplified antenna output.

Figure 1C:
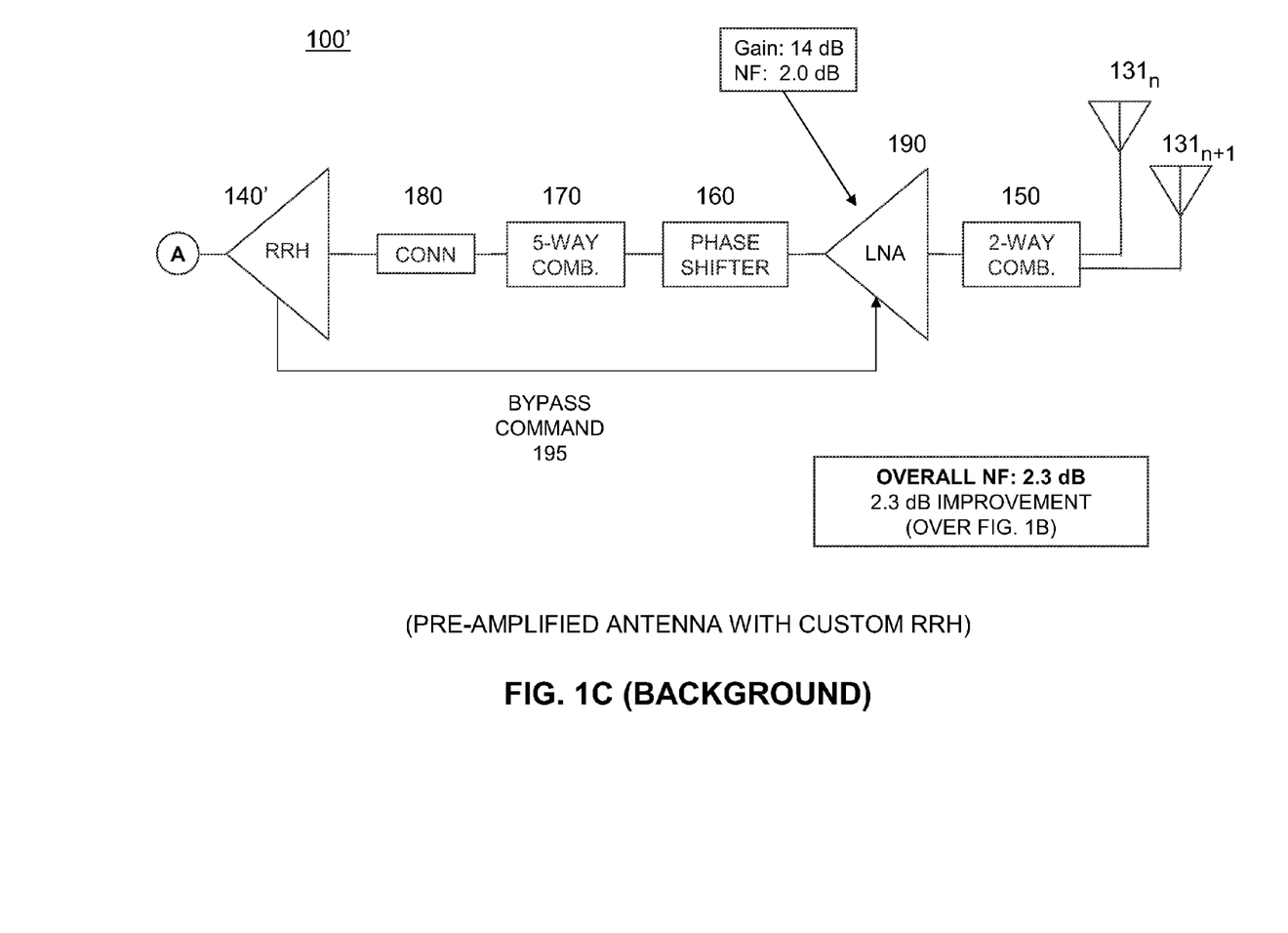
FIG. 1C provides an alternate conventional implementation of an antenna system using an amplifier to provide a pre-amplified antenna signal to a modified RRH.

FIG. 1C illustrates a receive path for conventional communication system 100' similar to conventional communication system 100 of FIG. 1B in which phase matched antenna pairs 131$_n$ and 131$_{n+1}$ may be combined in two-way power combiner 150, but which are then provided to LNA 190 for amplification before being sent over RF cable 152 to phase-shifter 160, and combined with similar signals from remaining combinations of antennas 131$_n$ and 131$_{n+1}$ in 5-way power combiner 170. RF cable 172 connects an output of 5-way combiner 170 to connector 180 which is further connected to jumper cable 182 for application to an input of a modified RRH 140'. In this modified configuration, RRH 140' has been customized by provision of an RGC to match the output power of LNA 190 to the desired input of RRH 140' to keep RRH 140' from being overdriven by LNA 190. In this example, the combination of losses contribute to an overall noise figure (NF) of 2.3 dB, a 2.3 dB improvement over the noise figure performance of conventional system 100.

FIG. 1C only illustrates a receive mode of operation, but system 100' actually is bi-directional, i.e., RRH 140' may be a transceiver that is capable of both transmitting and receiving RF signals, e.g., TDD signals. RRH 140' may be configured to provide bypass command 195 during a transmit cycle where relatively high power RF signals are prevented by bypass command 195 from interfering with the receive input of RRH 140' and the signal input to LNA 190.

Table II below provides a representative calculation for the NF of conventional communications system 100' using antenna unit 130 with pre-amplifier (e.g., LNA 190) and customized RRH 140', as illustrated in FIG. 1C.

TABLE II

Friis Equations for Concatenated Noise Figure

Calculation for LNA+ Antenna and Custom RRH (modified receiver)

| | Input Jumper | LNA+ | Jumper #1 | Phase Shifter | 5-way Divider | Jumper #2 | RGC Circuit | Jumper #3 + Con. | RRH |
|---|---|---|---|---|---|---|---|---|---|
| Component Data (from specifications) | | | | | | | | | |
| Gain (dB) | -0.1 | 14 | -0.25 | -0.5 | -0.5 | -0.25 | 0 | -0.5 | 25 |
| NF (dB) | 0.1 | 2 | 0.25 | 0.5 | 0.5 | 0.25 | 0 | 0.5 | 2.5 |
| Calculated linear data (=10^(dB/10)) | | | | | | | | | |
| Gain (linear) | 0.97723722 | 25.118864 | 0.944061 | 0.891251 | 0.891251 | 0.944061 | 1 | 0.891251 | 316.2278 |
| NF (linear) | 1.02329299 | 1.5848932 | 1.059254 | 1.122018 | 1.122018 | 1.059254 | 1 | 1.122018 | 1.778279 |
| Running total (cascaded) gain (product of linear gains) | | | | | | | | | |
| Gain (linear) | 0.97723722 | 24.547089 | 23.17395 | 20.6538 | 18.40772 | 17.37801 | 17.37801 | 15.48917 | 4897.788 |
| Running total (cascaded) F (use Friis Formula) | | | | | | | | | |
| NF (linear) | 1.02329299 | 1.6218101 | 1.624224 | 1.629489 | 1.635397 | 1.638616 | 1.638616 | 1.645637 | 1.695887 |
| Cascaded gain and noise figure (convert back to dB) | | | | | | | | | |
| NF (dB) | 0.1 | 2.1 | 2.106459 | 2.120515 | 2.136232 | 2.144772 | 2.144772 | 2.163342 | 2.29397 |
| Gain (dB) | -0.1 | 13.9 | 13.65 | 13.15 | 12.65 | 12.4 | 12.4 | 11.9 | 36.9 |

Total Gain Needs to be close to RRH Gain to protect receiver
Total Concatenated Noise Figure However, even if RRH 140' unit does include such an RGC and improves the overall system NF, the RGC approach identified above only partially solves problems in RRH architectures. System integrators are faced with the challenge of interfacing pre-amplified antenna systems such as the LNA+ with different types of RRH units whose developers/vendors would be burdened with an additional circuit configuration simply to satisfy the needs of one antenna system supplier. Furthermore, noise Figure improvement alone may not be the determining factor in deciding on the implementation details for a communication system.

What is needed is a system and method for modifying a pre-amplified antenna system such that it is compatible with a variety of different RRH units. What is further needed is a system and method for providing an adjustable receiver gain circuit associated with a pre-amplified antenna system such that any vendor's RRH may be used with a pre-amplified antenna. What is even further needed is a system and method for providing a negative gain amplifier used in conjunction with a pre-amplified antenna system such that any vendor's RRH may be used to prevent overdriving the RRH front-end and loss of DR, without requiring any changes to be made to an "off-the-the-shelf" RRH.

SUMMARY

Remote Radio Heads appear to be the choice for future wireless WAN solutions. Embodiments of this disclosure will improve their receiver performance, increasing range and data throughput, without requiring modifications to the current RRH.

The system and method of this disclosure provide various features, functions, and capabilities as discussed more fully in the detailed description, and as summarized below. For example, this disclosure provides a novel and useful system and method for providing a negative gain amplifier used in conjunction with a pre-amplified antenna system such that any vendor's RRH may be used to prevent overdriving the RRH front-end and loss of DR, without requiring any changes to be made to an "off-the-the-shelf" RRH.

In one or more embodiments, a "negative gain" element is incorporated into a circuit configured to be connected between a pre-amplified antenna and an RRH. This novel new circuit allows for the adjustment of gain compensation without modifying the RRH, allowing the potential for a variety of differently configured RRH's from different vendors to be used. This circuit may be provided separately from, or incorporated into the base of the pre-amplified antenna, e.g., the LNA+ antenna system, to allow any excess gain provided by the LNA+ TTLNA to be shed before the signal is presented to the RRH, thus protecting the receiver's DR without modification of the receiver front end.

In one embodiment, a communications system configured to improve a noise figure (NF) of a time division duplex (TDD) communications system includes a pre-amplified antenna unit comprising a plurality of antennas and associated low-noise amplifiers (LNA) contained therein, each of said associated LNA's being arranged to receive signals from a phase-matched pair of antennas selected from the plurality of antennas; for each of the phase-matched antenna pairs, a variable gain circuit is coupled to a TDD signal output of the associated LNA; and a remote radio head (RRH) is coupled to an output of the variable gain circuit, wherein the variable gain circuit is configured to provide a negative gain to the TDD signal appropriate to ensure that a dynamic range of the RRH is not reduced from a desired dynamic range.

In another embodiment, a variable gain circuit is configured to receive a time division duplex (TDD) communication signal from a pre-amplified antenna unit at a first power level and to output the communication signal to a remote radio head (RRH) at a second power level different than the first power level and includes an input terminal configured to receive a pre-amplified TDD communication signal from a low-noise amplifier (LNA) in the pre-amplified antenna unit; a first circulator having a first port coupled to the input terminal, a second port coupled to a receive signal path, and a third port coupled to a transmit signal path; a variable negative gain amplifier is coupled to the second port and configured to receive the pre-amplified TDD communication signal at an input thereof; a second circulator having a first port coupled to an output of the variable negative gain amplifier on the receive signal path, a second port coupled to an output terminal configured to provide an output to the RRH, and a third port coupled to the third port of the first circulator to form the transmit signal path, wherein the variable negative gain amplifier is configured to be adjusted to reduce the first power level to the second power level so as to avoid overdriving the RRH and reducing a dynamic range associated therewith.

In another embodiment, a method of improving a noise figure (NF) of a time-division duplex (TDD) communications system with a pre-amplified antenna arrangement, a variable gain element, and a remote radio head (RRH) operatively coupled together includes the steps of measuring a TDD signal power output by the pre-amplified antenna arrangement to an input of the RRH; determining whether the RRH input is being overdriven by the TDD signal power; if said RRH input is being overdriven, increasing a negative gain provided by the variable gain element so as to reduce a TDD signal power level provided to the RRH input; and if said RRH input is not being overdriven, maintaining a current negative gain setting of the variable gain element so as to at least temporarily set the TDD signal power level provided to the RRH input at predetermined power level, wherein the predetermined power level is established to maintain a full dynamic range of the RRH by avoiding overdriving the RRH input.

In yet another embodiment, a method of retrofitting a pre-amplified antenna unit configured to operate in a time-division duplex TDD communications system comprising a remote radio head (RRH) includes the steps of opening the pre-amplified antenna unit; opening one or more electrical connections between a low-noise amplifier (LNA) in the pre-amplified antenna unit and an output configured to connect to the RRH; operatively coupling a variable gain circuit between the LNA and the output, wherein the variable gain circuit is configured to provide a negative gain to a TDD communications signal output from the LNA so as to reduce a power level of the TDD communications signal, wherein the reduced power level TDD signal is provided as an input to the RRH, and wherein the negative gain is selected to avoid overdriving the input to the RRH and to preserve a dynamic range of the RRH.

DETAILED DESCRIPTION

Figure 3:
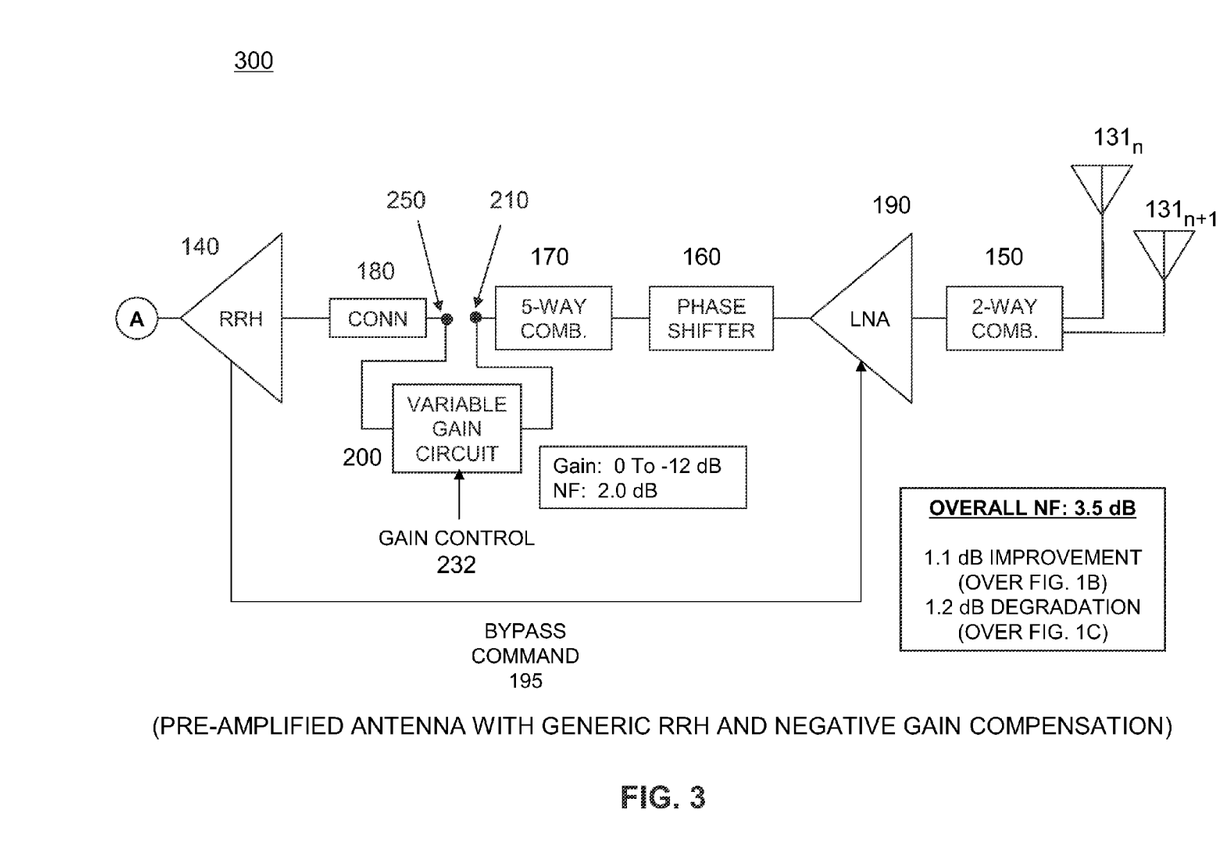
FIG. 3 illustrates an embodiment of an antenna system that incorporates the variable gain circuit of FIG. 2.

Turning to FIG. 3, communication system 300 is shown as illustrating a receive path similar to conventional communication system 100' of FIG. 1C. Phase-matched antennas 131$n$ and 131$_{n+1}$ may be combined in two-way power combiner 150, and are provided to LNA 190 for amplification before being provided to phase-shifter 160, and combined with similar signals from remaining combinations of antennas 131$_n$ and 131$_{n+1}$ in 5-way power combiner 170.

At this point, however, system 300 is seen to be different from conventional systems 100 and 100'. For example, an output of 5-way combiner 170 is applied to input 210 of variable gain circuit 200 (illustrated in FIG. 2), discussed further below. Output 250 of variable gain circuit 200 is provided to an input of conventional RRH 140 via connector 180, for example. One advantage of system 300 is that RRH 140 may be any type of known RRH, and does not have to be modified particularly to handle the output of LNA 190. Variable gain circuit 200 operates to "shed" any excess gain from LNA 190 that might adversely effect the dynamic range of RRH 140 if its input were to be overdriven.

FIG. 3 only illustrates a receive mode of operation, but system 300 is bi-directional, i.e., it both transmits and receives RF signals, e.g., TDD signals. Similar to conventional system 100', bypass command 195 may be provided to LNA 190 by RRH 140 during a transmit cycle where relatively high power RF signals would prevented from interfering with the input of RRH 140 and LNA 190.

In this example, the combination of losses contribute to an overall noise figure (NF) of 3.5 dB for system 300, a 1.1 dB improvement over the noise figure performance of conventional system 100, but a degradation of 1.2 dB in the noise figure performance compared to conventional system 100'.

As mentioned above, noise figure alone may not be the sole or determining factor that a communications or systems engineer focuses on in determining various system parameters. Additional concerns include the manufacturability, expense, and availability of various off-the-shelf components. In some circumstances, it may be desirable to "give up" the additional noise figure performance associated with a customized RRH (e.g., RRH 140') used with a pre-amplified amplified antenna for the benefit of being able to use a conventional RRH 140 from any of a number of vendors, and then inserting a negative gain provided by variable gain circuit 200 to match the RRH to the output of the LNA.

Table III below provides a representative calculation for the NF of communications system 300 using a pre-amplified antenna, without customizing the RRH.

TABLE III

| Friis Equations for Concatenated Noise Figure | | | | | | | | | |
|---|---|---|---|---|---|---|---|---|---|
| Calculation for LNA+ Antenna, Clearwire IPR and Off-the-Shelf RRH) | | | | | | | | | |
| | Input Jumper | LNA+ | Jumper #1 | Phase Shifter | 5-way Divider | Jumper #2 | RGC Circuit | Jumper #3 + Con. | RRH |
| Component Data (from specifications) | | | | | | | | | |
| Gain (dB) | -0.1 | 14 | -0.25 | -0.5 | -0.5 | -0.25 | -10 | -0.5 | 25 |
| NF (dB) | 0.1 | 2 | 0.25 | 0.5 | 0.5 | 0.25 | 2 | 0.5 | 2.5 |

TABLE III-continued

| Calculated linear data (=10^(dB/10)) | | | | | | | | | |
|---|---|---|---|---|---|---|---|---|---|
| Gain (linear) | 0.97723722 | 25.118864 | 0.944061 | 0.891251 | 0.891251 | 0.944061 | 0.1 | 0.891251 | 316.2278 |
| NF (linear) | 1.02329299 | 1.5848932 | 1.059254 | 1.122018 | 1.122018 | 1.059254 | 1.584893 | 1.122018 | 1.778279 |
| Running total (cascaded) gain (product of linear gains) | | | | | | | | | |
| Gain (linear) | 0.97723722 | 24.547089 | 23.17395 | 20.6538 | 18.40772 | 17.37801 | 1.737801 | 1.548817 | 489.7788 |
| Running total (cascaded) F (use Friis Formula) | | | | | | | | | |
| NF (linear) | 1.02329299 | 1.6218101 | 1.624224 | 1.629489 | 1.635397 | 1.638616 | 1.672273 | 1.742487 | 2.244987 |
| Cascaded gain and noise figure (convert back to dB) | | | | | | | | | |
| NF (dB) | 0.1 | 2.1 | 2.106459 | 2.120515 | 2.136232 | 2.144772 | 2.233072 | 2.411697 | 3.512138 |
| Gain (dB) | −0.1 | 13.9 | 13.65 | 13.15 | 12.65 | 12.4 | 2.4 | 1.9 | 26.9 |
| Total Gain Needs to be close to RRH Gain to protect receiver | | | | | | | | | |
| Total Concatenated Noise Figure | | | | | | | | | |

Figure 2:
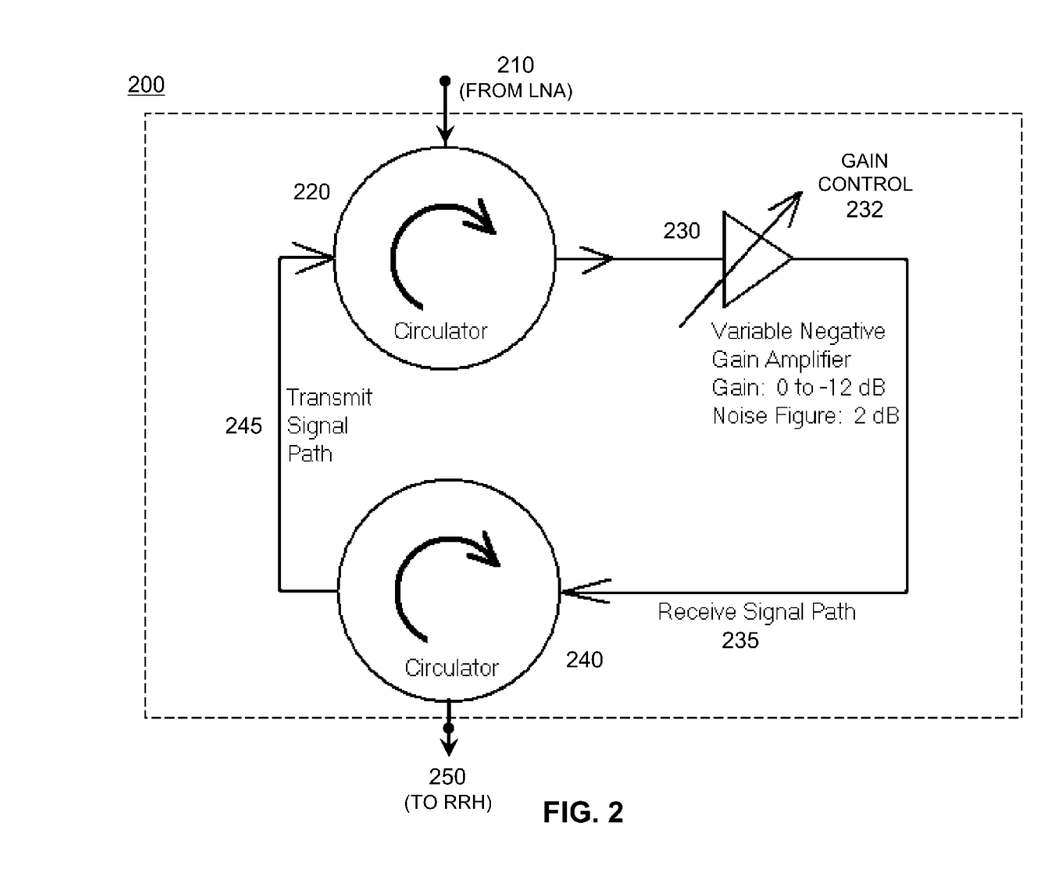
FIG. 2 illustrates an embodiment of a variable gain circuit of this disclosure.

Further details of an embodiment of variable gain circuit 200 are illustrated in FIG. 2. First port 210 of first circulator 220 receives a signal from an LNA, e.g., LNA 190. A second port of circulator 220 couples the signal from the LNA to an input of variable negative gain amplifier 230. The gain of variable negative gain amplifier 230 may be adjusted by gain control 232, which may be implemented manually by a technician, or remotely by computer processor control (not shown) in a known manner, e.g., through the use of AISG 2.0 compliant remote antenna commands or other remote antenna commands. An output of variable negative gain amplifier 230 is provided along receive signal path 235 to a first port of second circulator 240. In a receive mode, a second port 250 of circulator 240 provides an output to other circuitry and processing such as an RRH, e.g., RRH 140.

In a transmit mode, second port 250 of second circulator 240 receives a transmit signal from an RF power amplifier (not shown), and outputs the transmit signal through a third port of second circulator 240 and along transmit signal path 245 to a third port of first circulator 220. The transmit signal is then output from first port 210 to an antenna system, e.g., antenna system 130. It should be appreciated that the RRH and LNA are protected by additional bypass circuitry during a transmit mode to prevent overload and damage to sensitive circuitry, e.g., by bypass circuit 195. Variable negative gain amplifier 230 is protected during a transmit mode by the operation and arrangement of first and second circulators 220 and 240 such that a separate bypass circuit is not required to control variable negative gain amplifier 230. However, in other circuit configurations that may be used and which do not use circulators as described above, it is possible that other arrangements could expand the effect of bypass command 195 to also control variable negative gain amplifier 230. For example, a circuit configuration that accomplishes the same purposes of circulators 220 and 240 may be arranged using phase lines and shorted stubs as is known in the art, or by the use of hot carrier diodes or Schottky barrier diodes with fast turn on/off times to bypass variable negative gain amplifier 230. Thus, variable gain circuit 200 is not limited to the use of circulators, although circulators may be relatively easy to use in certain applications in various frequency ranges.

Variable gain circuit 200 may include a variable negative gain amplifier 230 adapted such that an absolute value of the negative gain of the variable negative gain amplifier is at least 2 dB less than a fixed gain value of the LNA in the pre-amplified antenna unit. Further, the negative gain of the variable negative gain amplifier may be adjustable between 0 and −12 dB. Generally, the negative gain may be adjustable as a function of a fixed gain value of the LNA in the pre-amplified antenna unit in order to shed any excess gain of the LNA to avoid overdriving an input of an RRH, resulting in a reduction in dynamic range of the RRH.

In some circumstances, a reduction in dynamic range may be desirable in view of other contrary system requirements. For example, to increase sensitivity of the RRH, the negative gain value in the pre-amplified antenna unit may be reduced to allow the LNA to drive the RRH harder.

Figure 5:
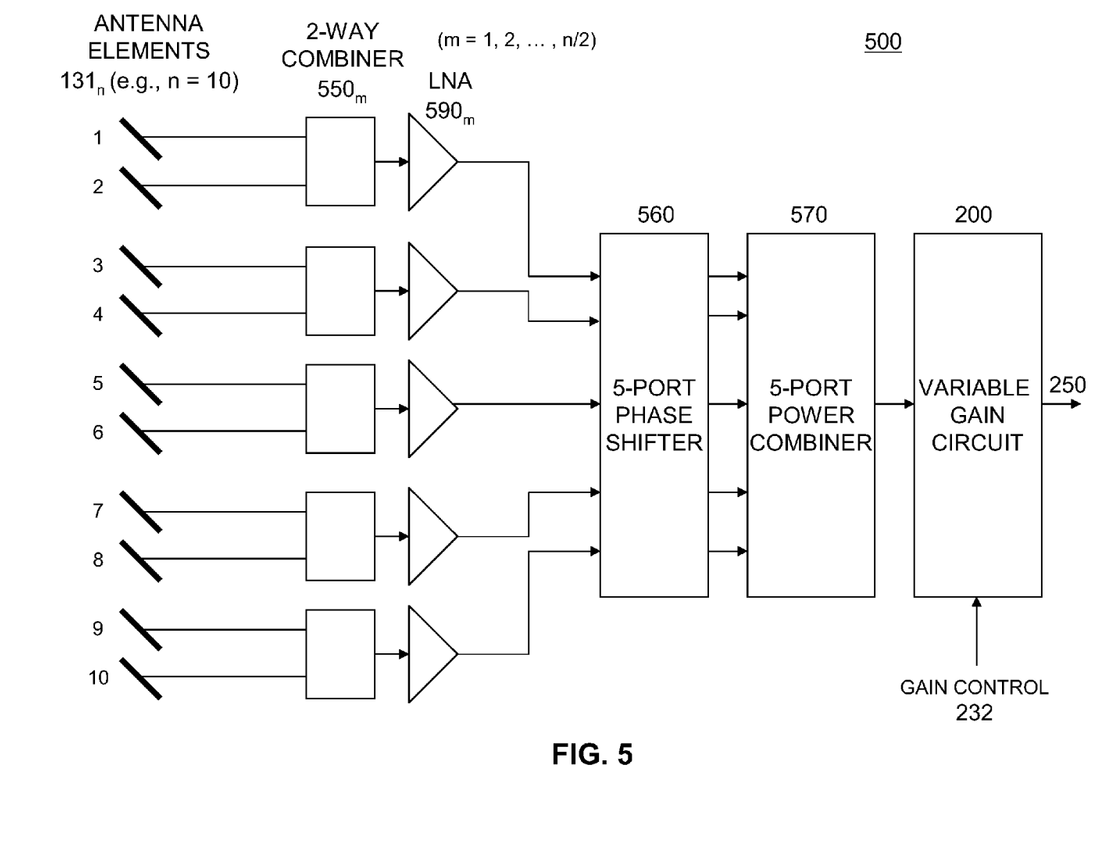
FIG. 5 illustrates additional details of the system of FIG. 3.

Turning to FIG. 5, further implementation details of the system of FIG. 3 are illustrated. For example, in one or more embodiments, system 500 includes antenna elements 131$_n$ and 131$_{n+1}$ each connected to 2-way power combiner 550$_m$, which is supplied to the input of an associated LNA 590$_m$. In this embodiment, the number of power combiners 550 and LNA's 590 ("m") may be selected to be half the number of antenna elements 131$_n$, i.e., m=n/2. Different configurations are possible by use of more complex multi-input power combiners with more than two inputs, for example, that would reduce the number of power combiners needed. The corresponding number of associated LNAs would also be reduced.

The outputs of each LNA$_m$ are provided to m-port phase shifter 560, e.g., m=5, where each input port has its phase "tuned" or tailored to account for the specific installation details, e.g., length of RF cabling or other factors that effect the phase shift desired for known antenna array beam forming, for example. Phase shifter 560 may include electromechanical linkages that allow adjustment of phase values to enable remote electrical tilt (RET) for antenna beam adjustment. The output of m-port phase shifter 560 is provided to m-port power combiner 570 which combines the phase shifted TDD antenna outputs into an output that is applied to variable gain circuit 200. Output terminal 250 may then be connected to a "generic" RRH, i.e., an RRH that is not specifically configured to operate with a pre-amplified antenna unit 130. The operation of variable gain circuit 200 has been previously described.

Figure 4:
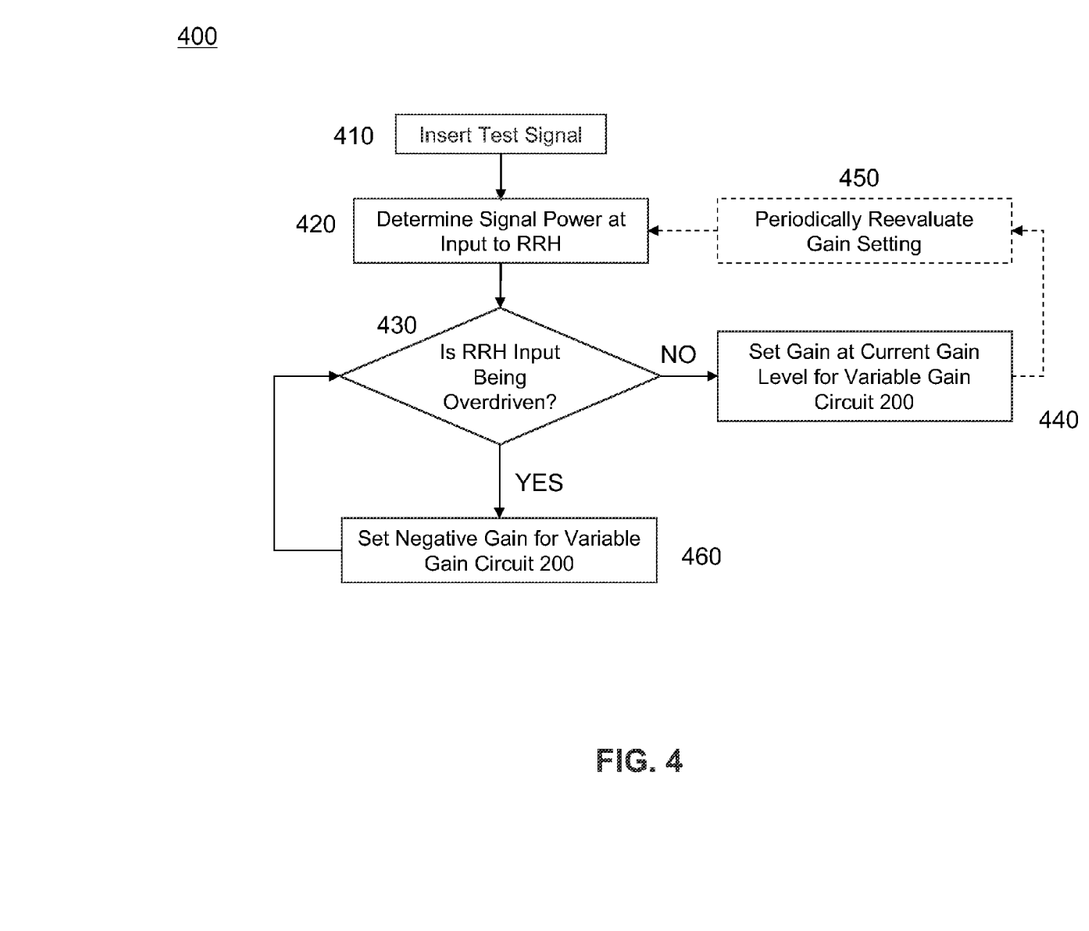
FIG. 4 provides a flowchart of an exemplary embodiment of a method of adjusting a variable gain setting in an antenna system.

Turning now to FIG. 4, a flowchart illustrating an embodiment of process 400 of improving the noise figure of a communications system is shown. At optional step 410, a test signal may be inserted at an appropriate point of the communications system, as would be appreciated by a person of ordinary skill in the art. At step 420, the signal power presented to an input to an RRH is measured, whether by the insertion of the optional test signal, or by the use of other signals present in the system. A determination is made at step 430 as to whether the RRH input is being overdriven. If the RRH is being overdriven, a negative gain is increased by a variable negative gain circuit (e.g., variable gain circuit 200) to shed the excess gain provided by the LNA, and the process returns to step 430 where the RRH input is reevaluated and the negative gain adjusted until the RRH is operating in a desired input range, e.g., where its dynamic range is preserved and the RRH input is allowed to operate in the linear portion of its input characteristic. The gain setting may be implemented manually either on site or in a factory setting, or the setting may be made remotely using AISG compliant remote antenna setting commands.

If, however, the RRH input is not being overdriven at step 430, the inserted negative gain is set at its current value and maintained until subsequently changed. Optionally, as indicated by the dashed lines, the negative gain may be reevaluated at step 450, and may be periodically reevaluated by an operator or by a system controller (not shown). Upon occasion of such reevaluation, the process continues at step 420 and the other steps of FIG. 4 as discussed above.

In another embodiment, a method of retrofitting a pre-amplified antenna unit configured to operate in a time-division duplex TDD communications system that includes a remote radio head (RRH) includes opening the pre-amplified antenna unit to expose components therein. Various electrical connections between the LNA in the pre-amplified antenna unit and an output configured to connect to the RRH would need to be disconnected, and a variable gain circuit would then be operatively connected between the LNA and the output to the RRH. The variable gain circuit would then be configured to provide a negative gain to the signal passing through, e.g., a TDD communications signal output from the LNA, so as to reduce a power level of the TDD communications signal. The reduced power level TDD signal would then be provided as an input to the RRH, and would be selected to avoid overdriving the input to the RRH and to preserve the dynamic range of the RRH. The method may further include closing the pre-amplified antenna unit and securing the variable gain circuit external to the pre-amplified antenna unit, i.e., as an external circuit, or the variable gain circuit may be secured within the pre-amplified antenna unit, i.e., as an integral unit, and then the pre-amplified antenna unit would be closed and appropriately sealed in accordance with required environmental factors.

In the discussion of various embodiments and aspects of the system and method of this disclosure, those with skill in the art will appreciate that the inventive concept described herein may work with various system configurations, and in various radio frequency regimes. In addition, various embodiments of this disclosure may be made in hardware, firmware, software, or any suitable combination thereof. Aspects of this disclosure may also be implemented as instructions stored on a machine-readable medium, which may be read and executed by one or more processors. A machine-readable medium may include any mechanism for storing or transmitting information in a form readable by a machine (e.g., a computing device). For example, a machine-readable storage medium may include read only memory, random access memory, magnetic disk storage media, optical storage media, flash memory devices, and others. Further, firmware, software, routines, or instructions may be described herein in terms of specific exemplary embodiments that may perform certain actions. However, it will be apparent that such descriptions are merely for convenience and that such actions in fact result from computing devices, processors, controllers, or other devices executing the firmware, software, routines, or instructions.

Various embodiments herein are described as including a particular feature, structure, or characteristic, but every aspect or embodiment may not necessarily include the particular feature, structure, or characteristic. Further, when a particular feature, structure, or characteristic is described in connection with an embodiment, it will be understood that such feature, structure, or characteristic may be included in connection with other embodiments, whether or not explicitly described. Thus, various changes and modifications may be made to this disclosure without departing from the scope or spirit of the inventive concept described herein. As such, the specification and drawings should be regarded as examples only, and the scope of the inventive concept to be determined solely by the appended claims.

What is claimed is:

1. A communications system configured to improve a noise figure (NF) of a time division duplex (TDD) communications system, the system comprising:
   a pre-amplified antenna unit comprising a first plurality of antennas and first associated low-noise amplifiers (LNA) contained therein, each of said first associated LNA's being arranged to receive a signal from a first phase-matched pair of antennas selected from the plurality of antennas; and
   a variable gain circuit coupled to a TDD output signal of at least one of the first associated LNA's, wherein the variable gain circuit is configured to provide a selected negative gain to the TDD output signal, wherein the selected negative gain ensures that an output signal from the variable gain circuit is suitable for application to a remote radio head (RRH) input such that a dynamic range of the RRH input is not reduced below a desired dynamic range.

2. The system of claim 1, further comprising a remote radio head (RRH) arranged in the system so as to receive the output TDD signal from the variable gain circuit.

3. The system of claim 1, wherein the variable gain circuit is arranged to receive a combined TDD input signal obtained from a plurality of LNA's each coupled to a different first phase-matched pair of antennas selected from the first plurality of antennas.

4. The system of claim 1, wherein the first plurality of antennas comprises 10 antennas each having a same first phase relationship associated therewith.

5. The system of claim 1, further comprising a second plurality of antennas and second associated low-noise amplifiers (LNA) contained therein, each of said second associated LNA's being arranged to receive a signal from a second phase-matched pair of antennas selected from the second plurality of antennas, wherein the second phase-matched pair of antennas has a different phase relationship than the first phase-matched pair of antennas.

6. The system of claim 2, wherein the WAN data communications system operates in a Gigahertz frequency band.

7. The system of claim 1, wherein the TDD communications system comprises a wireless wide area network (WAN) data communications system.

8. The system of claim 1, wherein the plurality of first phase-matched antenna pairs comprise five antenna pairs.

9. The system of claim 1, wherein the pre-amplified antenna unit comprises a bi-directional antenna unit suitable for both transmitting and receiving TDD signals.

10. The system of claim 1, further comprising a bypass control signal configured to bypass the first associated LNA's when the TDD communications system is in a transmit mode.

11. The system of claim 1, wherein said variable gain circuit is arranged and enclosed within the pre-amplified antenna unit.

12. A communications system configured to improve a noise figure (NF) of a time division duplex (TDD) communications system, the system comprising:
   a pre-amplified antenna unit comprising a first plurality of antennas and first associated low-noise amplifiers (LNA) contained therein, each of said first associated LNA's being arranged to receive a signal from a first phase-matched pair of antennas selected from the plurality of antennas; and a variable gain circuit coupled to a TDD output signal of at least one of the first associated LNA's, wherein the variable gain circuit is configured to provide a selected negative gain to the TDD output signal, wherein said variable gain circuit comprises:
  a first circulator having a first port coupled to the at least one of the first associated LNA's, a second port coupled to a receive signal path, and a third port coupled to a transmit signal path;
  an adjustable negative gain amplifier coupled to the second port and configured to receive the TDD signal output of the at least one of the first associated LNA's at an input thereof; and
  a second circulator having a first port coupled to an output of the adjustable negative gain amplifier on the receive signal path, a second port coupled to an output terminal configured to provide an output to the RRH, and a third port coupled to the third port of the first circulator to form the transmit signal path,
  wherein the adjustable negative gain amplifier is configured to be adjusted to reduce a power level of the TDD signal output of the at least one of the first associated LNA's to a lower power level so as to avoid overdriving an input of the RRH.

13. The system of claim 1, wherein the variable gain circuit is adapted to operate in a wireless wide area network (WAN) data communications system.

14. The system of claim 12, wherein the pre-amplified antenna unit is a bi-directional antenna unit,
  wherein, in a transmit mode, the second port of the second circulator receives a transmit TDD signal that is supplied to the third port of the first circulator on the transmit path,
  wherein the transmit TDD signal is output from the first port of the first circulator and coupled to the plurality of antenna pairs after bypassing the associated LNA's.

15. A variable gain circuit configured to receive a time division duplex (TDD) communication signal from a pre-amplified antenna unit at a first power level and to output the communication signal to an external remote radio head (RRH) at a second power level different than the first power level, the circuit comprising:
  an input terminal configured to receive a pre-amplified TDD communication signal from a low-noise amplifier (LNA) in the pre-amplified antenna unit;
  a first circulator having a first port coupled to the input terminal, a second port coupled to a receive signal path, and a third port coupled to a transmit signal path;
a variable negative gain amplifier coupled to the second port and configured to receive the pre-amplified TDD communication signal at an input thereof;
  a second circulator having a first port coupled to an output of the variable negative gain amplifier on the receive signal path, a second port coupled to an output terminal configured to provide an output to the external RRH, and a third port coupled to the third port of the first circulator to form the transmit signal path,
  wherein the variable negative gain amplifier is configured to be adjusted to reduce the first power level to the second power level so as to avoid overdriving the external RRH and undesirably reducing a dynamic range associated therewith.

16. The variable gain circuit of claim 15, wherein the transmit signal path bypasses an amplifying unit the variable negative gain amplifier.

17. The variable gain circuit of claim 15, wherein the variable negative gain amplifier comprises a manual gain adjustment.

18. The variable gain circuit of claim 15, wherein the variable negative gain amplifier comprises a gain adjustment responsive to a gain adjustment command signal.

19. The variable gain circuit of claim 18, wherein the gain adjustment command signal is in compliance with AISG 2.0 remote antenna control standards.

20. The variable gain circuit of claim 15, wherein an absolute value of the negative gain of the variable negative gain amplifier is at least 2 dB less than a fixed gain value of the LNA in the pre-amplified antenna unit.

21. The variable negative gain amplifier of claim 15, wherein a negative gain associated therewith is adjustable between 0 and −12 dB.

22. The variable negative gain amplifier of claim 15, wherein a negative gain associated therewith is adjustable as a function of a fixed gain value of the LNA in the pre-amplified antenna unit.

23. A method of improving a noise figure (NF) of a time-division duplex (TDD) communications system comprising a pre-amplified antenna arrangement, a variable gain element, and a remote radio head (RRH) operatively coupled together, the method comprising:
  measuring a TDD signal power output by the pre-amplified antenna arrangement to an input of the RRH;
  determining whether the RRH input is being overdriven by the TDD signal power;
  if said RRH input is being overdriven, increasing a negative gain provided by the variable gain element so as to reduce a TDD signal power level provided to the RRH input; and
  if said RRH input is not being overdriven, maintaining a current negative gain setting of the variable gain element so as to at least temporarily set the TDD signal power level provided to the RRH input at predetermined power level,
  wherein the predetermined power level is established to maintain a full dynamic range of the RRH by avoiding overdriving the RRH input.

24. The method of claim 23, further comprising inserting a test signal to represent the TDD signal output by the pre-amplified antenna arrangement.

25. The method of claim 23, further comprising reevaluating the current negative gain setting of the variable gain element to determine whether the RRH input is being overdriven.

26. The method of claim 25, wherein said reevaluating is conducted on a periodic basis.

27. A method of retrofitting a pre-amplified antenna unit configured to operate in a time-division duplex TDD communications system comprising a remote radio head (RRH), the method comprising:
  opening the pre-amplified antenna unit;
  opening one or more electrical connections between a low-noise amplifier (LNA) in the pre-amplified antenna unit and an output configured to connect to the RRH;
  operatively coupling a variable gain circuit between the LNA and the output,
  wherein the variable gain circuit is configured to provide a negative gain to a TDD communications signal output from the LNA so as to reduce a power level of the TDD communications signal passed therethrough, wherein the reduced power level TDD signal is provided as an input to the RRH, and wherein the negative gain is selected to avoid overdriving the input to the RRH and to preserve a desired dynamic range of the RRH.

28. The method of claim 27, further comprising closing the pre-amplified antenna unit and securing the variable gain circuit external to the pre-amplified antenna unit.

29. The method of claim 27, further comprising securing the variable gain circuit completely within the pre-amplified antenna unit and closing the pre-amplified antenna unit.

* * * * *